United States Patent [19]
Tashiro et al.

[11] Patent Number: 5,668,407
[45] Date of Patent: Sep. 16, 1997

[54] INTEGRATED CIRCUIT CARRIER HAVING LEAD-SOCKET ARRAY WITH VARIOUS INNER DIMENSIONS

[75] Inventors: Kazuhiro Tashiro; Tetsushi Wakabayashi, both of Kawasaki, Japan

[73] Assignee: Fujitsu Limited, Kawasaki, Japan

[21] Appl. No.: 673,095

[22] Filed: Jul. 1, 1996

Related U.S. Application Data

[63] Continuation of Ser. No. 444,257, May 18, 1995, abandoned, which is a continuation of Ser. No. 220,037, Mar. 30, 1994, abandoned.

[30] Foreign Application Priority Data

Jul. 5, 1993 [JP] Japan ................... 5-164918

[51] Int. Cl.$^6$ ................................. H01L 23/48
[52] U.S. Cl. .................. 257/692; 257/694; 257/727; 257/785; 257/697; 361/772
[58] Field of Search ................... 257/773, 674, 257/697, 48, 797, 693, 694, 727, 785, 692; 361/772

[56] References Cited

U.S. PATENT DOCUMENTS 4,725,692  2/1988  Ishii et al. ............... 174/52 FP
4,875,138  10/1989  Cusack ................... 174/52.4

Primary Examiner—Jerome Jackson
Assistant Examiner—Nathan K. Kelley
Attorney, Agent, or Firm—Staas & Halsey

[57] ABSTRACT

An IC carrier for electric testing of an IC package enables an IC package to be loaded on or unloaded from it smoothly without bending any of closely arranged fine leads, and prevents the leads from being deformed by falling impact when it is dropped. The IC carrier for an IC package, having an array of leads, comprises an array of sockets for mating with the array of leads, wherein selected one of the sockets differs in clearance between a width of each of the sockets and a width of each of the leads to be mated from the other ones in a cross section of an array. For instance, an array of sockets having holes to mate with leads having a single diameter of an IC package are arranged so that inner diameters of the holes in an outer part of the array is larger than those in a central part of the array. The technique is applicable to both a flat IC package (QFP or SOP) and a pin grid array IC package (PGA).

21 Claims, 8 Drawing Sheets

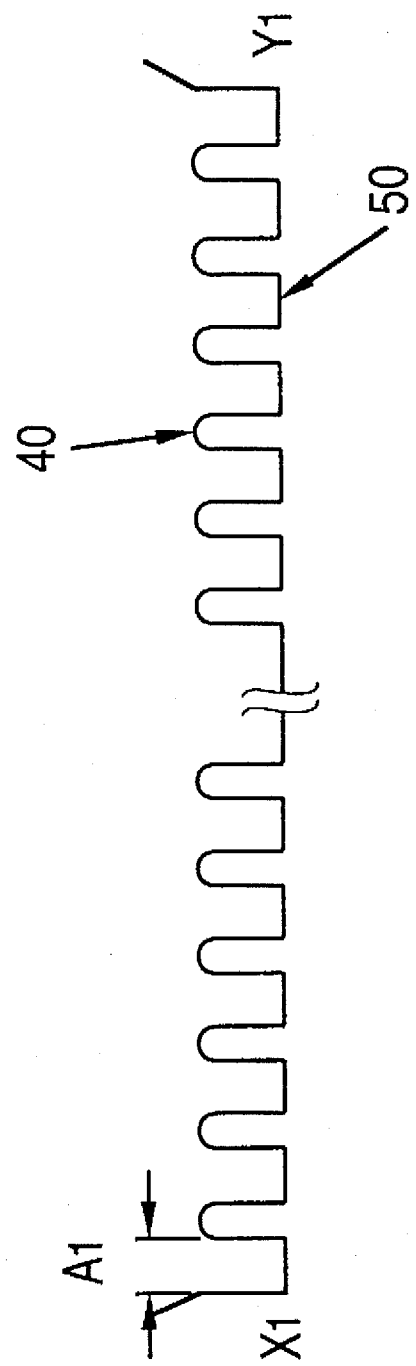

A2 > A1

A5 > A4 > A3 > A2 > A1

$B2 > B1$ $B4 > B3 > B2 > B1$

INTEGRATED CIRCUIT CARRIER HAVING LEAD-SOCKET ARRAY WITH VARIOUS INNER DIMENSIONS

This application is a continuation of application Ser. No. 08/444,257, filed May 18, 1995, now abandoned, which is a continuation of application Ser. No. 08/220,037, filed Mar. 30, 1994, now abandoned.

BACKGROUND OF THE INVENTION

1. Field of the Invention

The present invention relates to an integrated circuit (IC) carrier for testing an IC, more specifically to IC carriers for a flat package (QFP, SOP) and a pin grid array package (PGA) having a closely arranged fine lead array.

2. Description of the Prior Art

Since it is easy for closely arranged fine leads in an array projected out of an IC package to be bent by handling, electric testing is usually carried out by loading an IC package on an IC carrier. FIG. 1A shows a conventional IC carrier 1 for a QFP type package 2 having a flat lead array 3, and the IC carrier has an array of sockets 4. FIG. 1B shows an enlarged part of the array of sockets where a lead 30 is inserted in a socket 50 between separation walls 40. FIG. 1C shows a cross-sectional view of the socket array by looking at it in the direction of arrows $X_1$ and $Y_1$ indicated in FIG. 1A. All sockets in an array have the same inner width denoted by $A_1$ between separation walls 40. FIG. 2A shows also a conventional IC carrier 7 for a PGA type package 8 having a two dimensional array of leads 9, and the IC carrier has a two dimensional array of sockets 10. FIG. 2B shows an enlarged part of the array of sockets where a lead 90 is inserted into a socket 100. FIG. 2C shows a cross-sectional view of the socket array by looking at it in the direction of arrows $X_2$ and $Y_2$ indicated in FIG. 2A. All sockets 100 in an array have the same inner diameter denoted by $B_1$ with a tapered side-wall 11.

Since each of leads of an IC package in either type is arranged closely and tightly inserted into a socket, the outward stress on the side wall of each socket accumulates successively and resultantly makes the position of sockets in outer portion of an array displace outward considerably. Alternately, when the closely arranged fine leads are inserted in the socket, it often happens at an initial stage of the insertion that leads in some part of an array are already inserted, while leads in some other part of the same array are not inserted yet. Consequently, the uninserted lead may push laterally the separation (or side) wall excessively enough to be deformed. Particularly, if an allowable error in a lead array has an opposite direction to that in the relevant socket array, smooth loading or unloading of IC package becomes harder without deformation of leads.

SUMMARY OF THE INVENTION

It is a primary object of the present invention to provide an IC carrier onto which an IC package can be smoothly loaded on or unloaded from without deforming its leads.

It is another object of the present invention to provide an IC carrier which prevents leads of an IC package from being deformed by falling impact when an IC package loaded on an IC carrier is dropped.

According to the present invention, an IC carrier for either QFP type IC package or PGA type one comprises an array of lead sockets having various inner dimensions for a usual IC package having a lead array of a single inner dimension, and particularly, inner dimensions in an outer part of an array of lead sockets are larger than those in a central part of the array.

BRIEF DESCRIPTION OF THE DRAWINGS

FIG. 1C is a cross-sectional view of the socket array shown in FIG. 1A.

DESCRIPTION OF THE PREFERRED EMBODIMENTS

The preferred embodiments of the present invention will now be described in detail with illustrations.

Figure 1A:
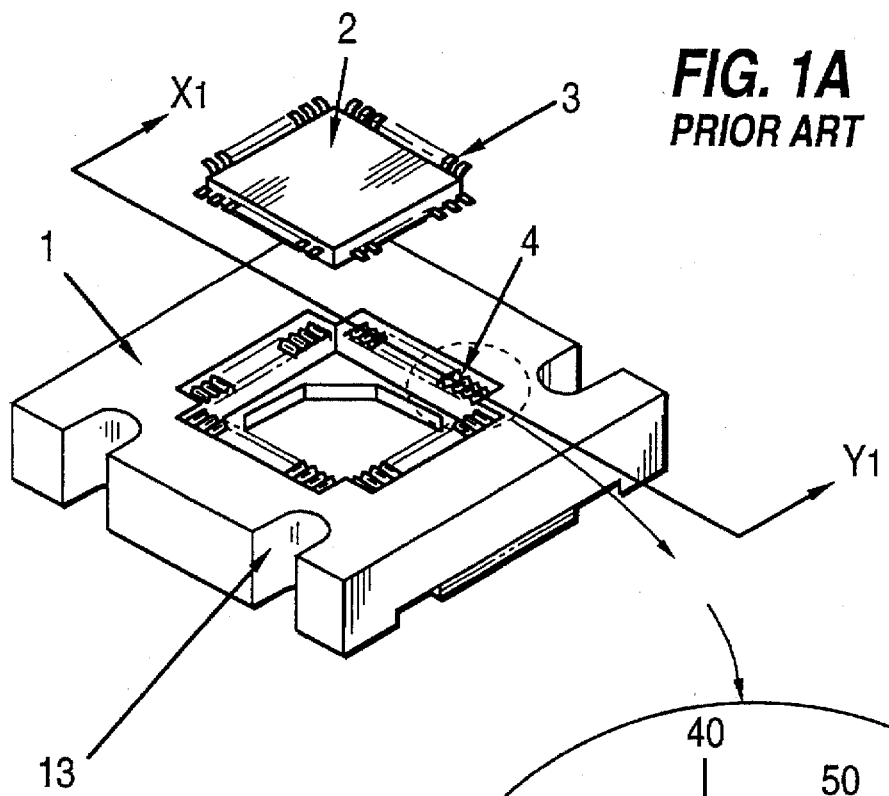
FIG. 1A is a conventional IC carrier with a QFP type package.
Figure 1B:
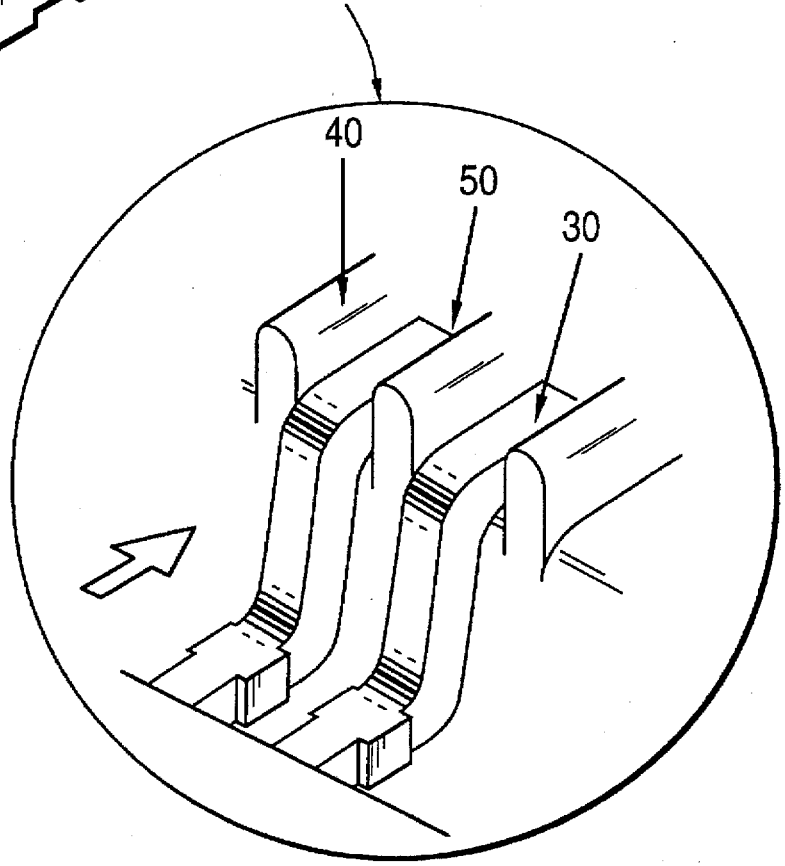
FIG. 1B is an enlarged part of the array of lead sockets with inserted leads shown in FIG. 1A.
Figure 2A:
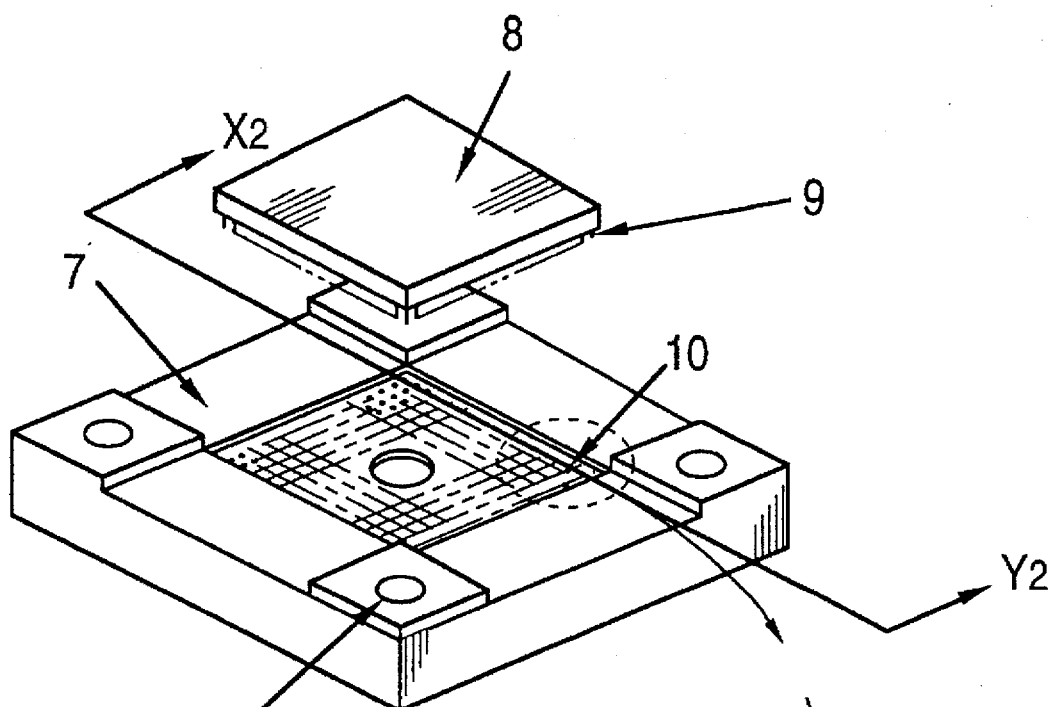
FIG. 2A is a conventional IC carrier with a PGA type package.
Figure 2B:
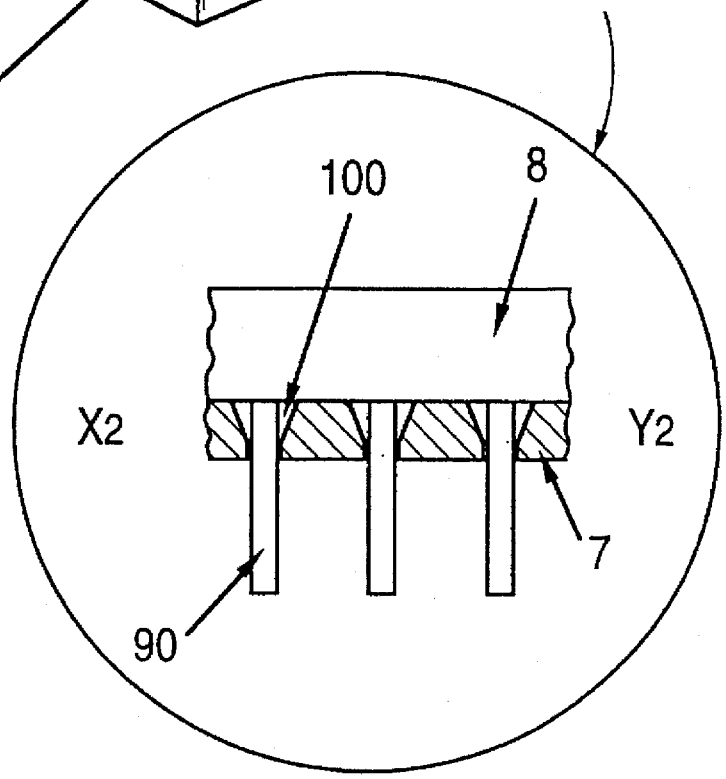
FIG. 2B is an enlarged part of the array of lead sockets with inserted leads shown in FIG. 2A.
Figure 2C:
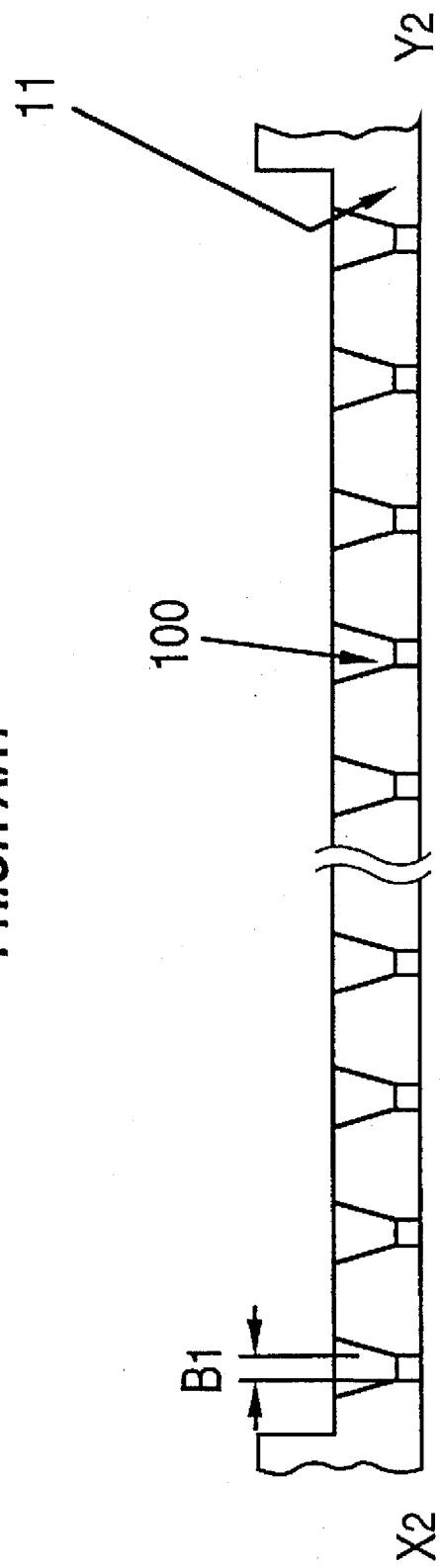
FIG. 2C is a cross-sectional view of the socket array shown in FIG. 2A.

Since IC carriers of the present invention are the same as those of the prior art in their basic structure, outer dimensions, and materials, the cross section $X_1$–$Y_1$ in FIG. 1A or $X_2$–$Y_2$ in FIG. 1B can also represent the cross section of IC carriers according to the present invention. Electric testing of IC packages is carried out in the same way with IC carriers for both the present invention and the prior art. For the testing, an IC package of QFP type 2, and PGA type 8 are loaded on the IC carrier 1 and 7 as shown in FIG. 1A, and FIG. 1B, respectively. Each of IC carriers is further mounted on a testing board with electric connection between leads and sockets by aligning guiding notches 13 of a QFP type IC carrier or holes 14 of a PGA type one to guiding poles of the testing board (not shown).

Figure 3A:
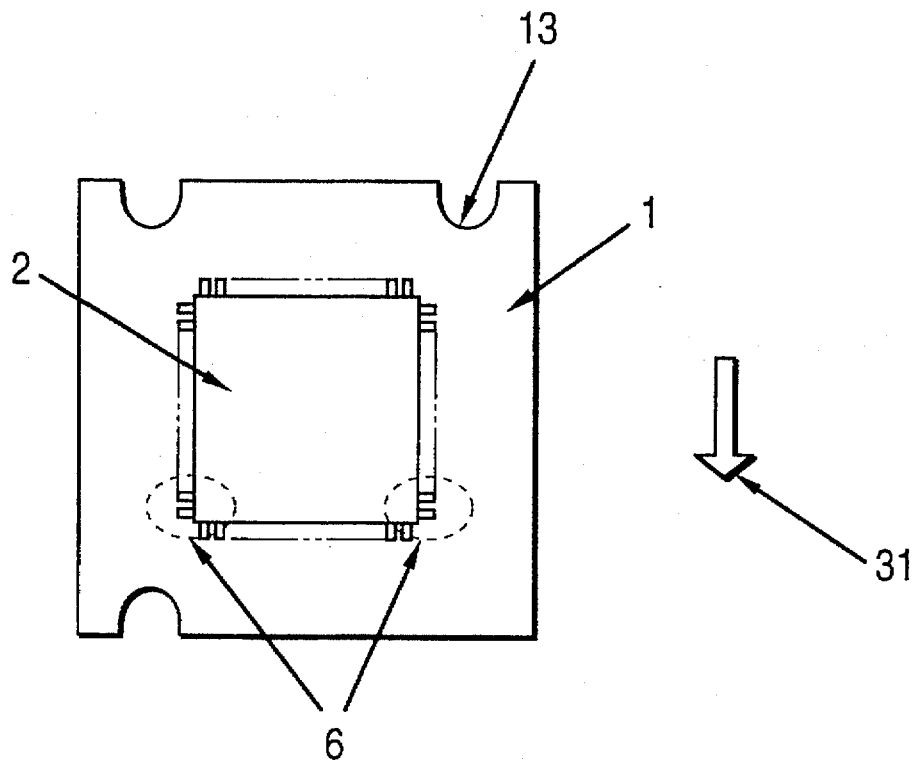
FIG. 3A is an IC carrier loaded with a QFP type package in drop test.

FIG. 3A shows an IC carrier 1 loaded with a PGA type package 2 in drop test. When the IC carrier is dropped in the direction indicated by an arrow 31, deformation of Leads occurs in lower part of vertical arrays of both sides indicated by 6.

Figure 3B:
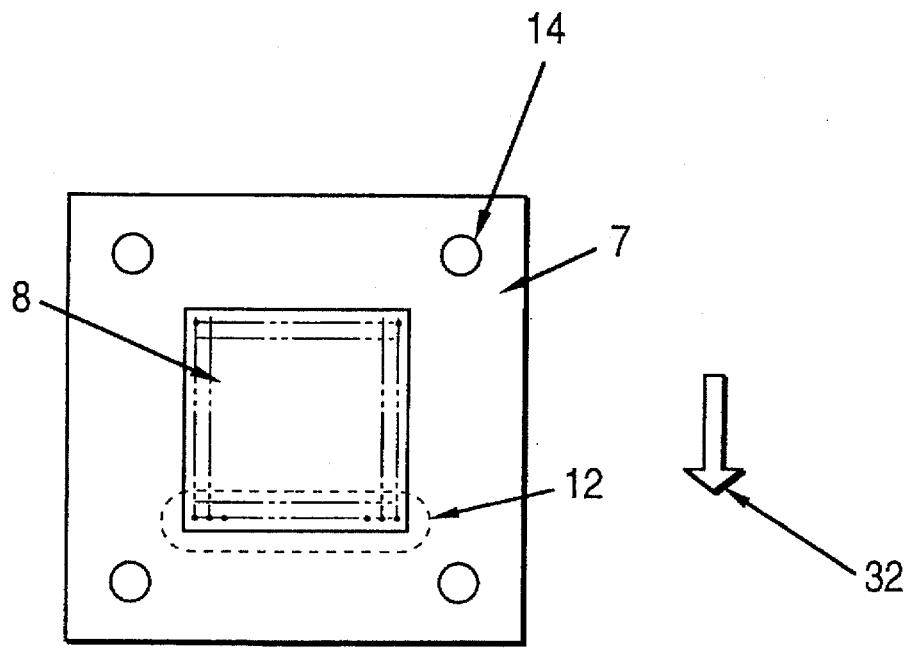
FIG. 3B is an IC carrier loaded with a PGA type package in drop test.

FIG. 3B shows an IC carrier 7 loaded with a PGA type package 8 in a drop test. When the IC carrier is similarly dropped in the direction indicated by an arrow 32, deformation of Leads occurs in an entire part of the lower horizontal array indicated by 12.

Figure 4A:
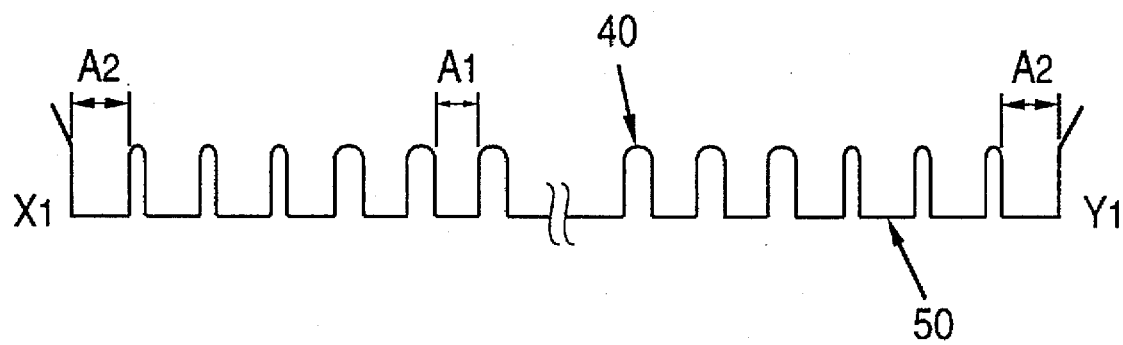
FIG. 4A is a cross-sectional view of a socket array for a QFP type package according to the first embodiment.

FIG. 4A shows a cross-sectional view of a socket array for a QFP type package according to the first embodiment. An inner dimension between the separation walls 40 in an outer part $A_2$ is larger than that in a central part $A_1$. More specifically, an IC carrier is formed by injection mold of heat-resistant engineering plastics such as sulfonic polyether, and for a specific example, $A_1=0.36$ mm, and $A_2=0.40$ mm for a spacing between leads 0.20 mm.

Figure 4B:
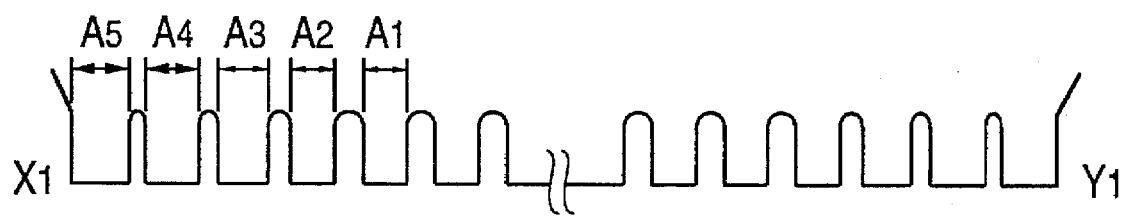
FIG. 4B is a cross-sectional view of a socket array for a QFP type package according to the second embodiment.

FIG. 4B shows a cross-sectional view of a socket array for a QFP type package according to the second embodiment. The inner dimension increases from a central part to outer parts of both sides, namely $A_5>A_4>A_3>A_2>A_1$. For a specific example, $A_5=0.40$ mm and $A_1=0.36$ mm, with an increment 0.01 mm per a socket.

Figure 5A:
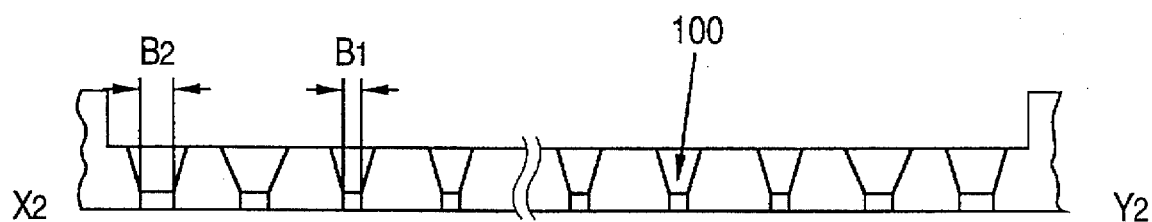
FIG. 5A is a cross-sectional view of a socket array for a PGA type package according to the third embodiment.

FIG. 5A shows a cross-sectional view of a socket array for a PGA type package according to the third embodiment. An inner diameter of a socket 100 in outer parts $B_2$ of both sides is larger than that in a central part $B_1$. For a specific example, $B_1=0.22$ mm, and $B_2=0.25$ mm for a spacing between leads 0.20 mm.

Figure 5B:
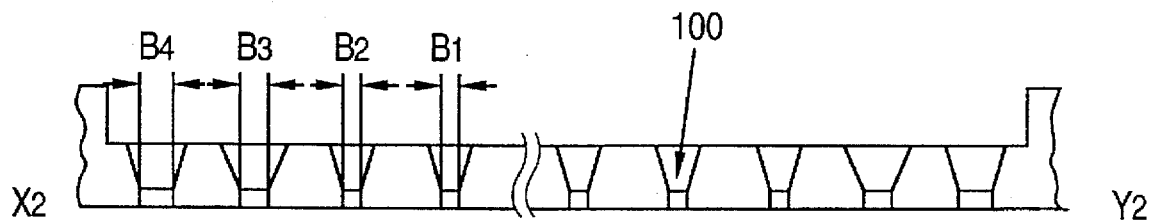
FIG. 5B is a cross-sectional view of a socket array for a PGA type package according to the fourth embodiment.

FIG. 5B shows a cross-sectional view of a socket array for a PGA type package according to the fourth embodiment. An inner diameter increases from a central part to outer parts of both sides, namely $B_5>B_4>B_3>B_2>B_1$. For a specific example, $B_5=0.25$ mm and $B_1=0.22$ mm, with an increment 0.01 mm per a socket.

Figure 6A:
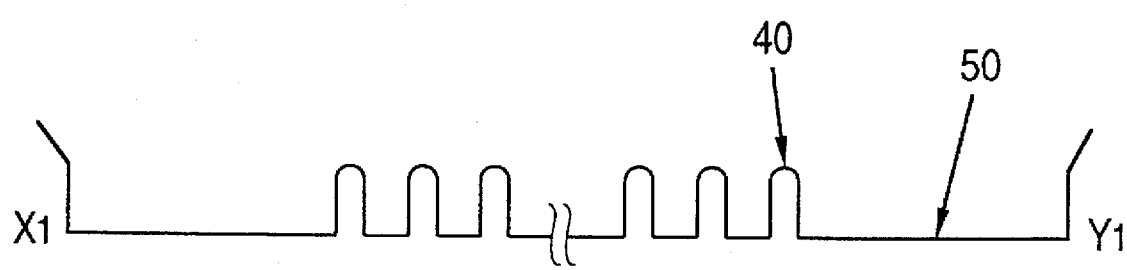
FIG. 6A is a cross-sectional view of a socket array for a QFP type package according to the fifth embodiment.

FIG. 6A shows a cross-sectional view of a socket array for a QFP type package according to the fifth embodiment. Side walls in outer parts of both sides in the socket array are removed. All leads are inserted correctly in each respective socket by aligning to the side-wall in the central part within an allowable error.

Figure 6B:
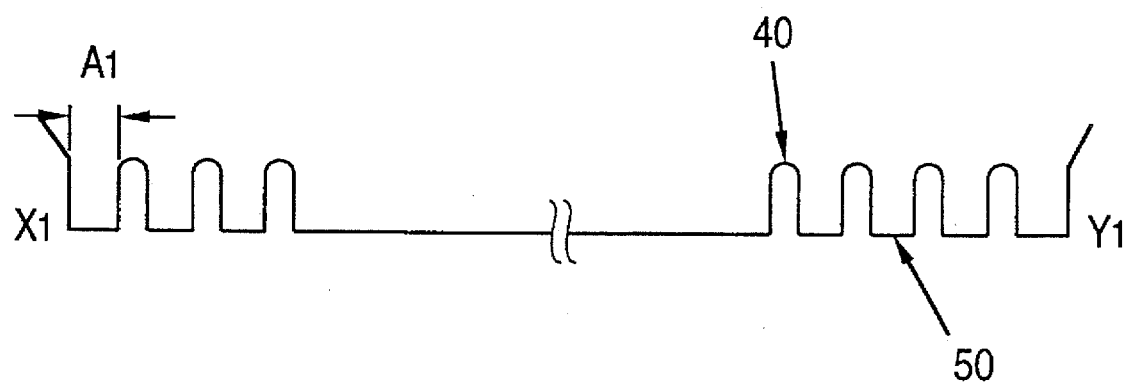
FIG. 6B is a cross-sectional view of a socket array for a QFP type package according to the sixth embodiment.

FIG. 6B shows a cross-sectional view of a socket array for a QFP type package according to the sixth embodiment. Side walls in a central part of the socket array are removed. All leads can be inserted correctly in each respective socket by aligning to the side-wall in outer parts of both sides within an allowable error be loaded on and unloaded from the relevant IC carrier easily without bending leads, and leads are protected against falling impact by deconcentrating the impact stress.

What is claimed is:

1. An integrated circuit (IC) carrier for an IC package having an array of leads comprising:
   an array of socket means for mating with the array of leads, wherein selected one of said socket means differs in clearance between a width of each of said socket means and a width of each of the leads to be mated from the other ones in a cross section of an array.

2. The IC carrier according to claim 1, wherein each of said socket means is separated from a neighboring one by a separating wall, and the width of each of said socket means is an inner width between a pair of the neighboring separation walls in a cross section normal to the separation wall in an array of said socket means for a flat IC package.

3. The IC carrier according to claim 2, wherein said socket means in an array are arranged so that the clearance in an outer part of an array of said socket means is larger than that in a central part of said array of said socket means.

4. The IC carrier according to claim 3, wherein said socket means in an array are arranged so that the clearance increases one by one from the central part to the outer part in an array of said socket means.

5. The IC carrier according to claim 1, wherein each of said socket means has a hole into which each of the leads of a pin grid array (PGA) IC package inserts to be mated, and the clearance is that between an inner diameter of the hole and a diameter of each of the leads in an array of said socket means.

6. The IC carrier according to claim 5, wherein said socket means in an array are arranged so that the clearance in an outer part of an array of said socket means is larger than that in a central part of an array of said socket means.

7. The IC carrier according to claim 5, wherein said socket means in an array are arranged so that the clearance increases hole by hole from a central part to an outer part in an array of said socket means.

8. An integrated circuit unit for electric testing comprising:
   a semiconductor chip having bonding pads,
   an IC package having an array of leads which are projected out of said IC package, and assembled with said semiconductor chip by electrically connecting the array of leads with each of the bonding pads inside said IC package, and
   an IC carrier having an array of socket means for mating with the array of leads, wherein selected one of said socket means differs in clearance between a width of each of said socket means and a width of each of the leads to be mated from the other ones in a cross section of the array.

9. The integrated circuit unit according to claim 8, wherein said IC package is mounted on said IC carrier by inserting the array of leads into the array of socket means.

10. An integrated circuit (IC) carrier for an IC package having an array of leads comprising:
    an array of sockets mating with the array of leads, wherein each of said sockets has a clearance dimension associated therewith, said clearance dimension being the difference between the width of said socket and the width of a corresponding lead among the array of leads, and wherein a selected one of said sockets has an associated clearance dimension which differs from clearance dimensions associated with other sockets in the array.

11. The IC carrier according to claim 10, wherein each of said sockets is separated from a neighboring one by a separating wall, and the width of each of said sockets is an inner width between a pair of the neighboring separation walls in a cross section normal to the separation walls in the array of said sockets for the IC package.

12. The IC carrier according to claim 11, wherein sockets in the array are arranged so that clearance dimensions associated with said sockets in an outer part of the array of said sockets is larger than that in a central part of said array of said sockets.

13. The IC carrier according to claim 12, wherein said sockets in the array are arranged so that clearance dimensions associated with said sockets increase one by one from the central part to the outer part in the array of said sockets.

14. An IC carrier for an IC package having an array of leads comprising:
    an array of sockets mating with the array of leads, wherein each of said sockets has a hole into which each of the leads of a pin grid array (PGA) IC package is inserted to be mated, and has a clearance dimension associated therewith, said clearance dimension being a difference between an inner diameter of the hole and a diameter of each of the leads in the array of said sockets, and wherein a selected one of said sockets has an associated clearance dimension which differs from clearance dimensions associated with other sockets in the array.

15. The IC carrier according to claim 14, wherein said sockets in the array are arranged so that clearance dimensions associated with said sockets in an outer part of the array of said sockets are larger than that in a central part of the array of said sockets.

16. The IC carrier according to claim 14, wherein said sockets in the array are arranged so that clearance dimensions associated with said sockets increase hole by hole from a central part to an outer part in the array of said sockets.

17. An integrated circuit unit for electric testing comprising:

a semiconductor chip having bonding pads, an IC package having an array of leads which are projected out of said IC package, and assembled with said semiconductor chip by electrically connecting the array of leads with each of the bonding pads inside said IC package, and an IC carrier having an array of sockets mating with the array of leads, wherein selected one of said sockets differs in clearance between a width of each of said sockets and a width of each of the leads to be mated from the other ones in a cross section of the array.

18. The integrated circuit unit according to claim 17, wherein said IC package is mounted on said IC carrier by inserting the array of leads into the array of sockets.

19. An integrated circuit (IC) carrier for an IC package having an array of leads comprising:

an array of sockets for mating with the array of leads, wherein said array of sockets consists of a first set of said array of sockets and a second set of said array of sockets, a socket in the first set of said array of sockets has a space receiving, by insertion therein, a plurality of leads arranged in series of the array of leads and a socket in the second set of said array of sockets has a space receiving by insertion therein, a single lead of the array of leads.

20. The IC carrier according to claim 19, wherein the first set of said array of sockets occupies an outer part of said array of sockets and the second set of said array of sockets occupies the central part of said array of sockets.

21. The IC carrier according to claim 19, wherein the first set of said array of the sockets occupies the central part of said array of sockets and the second set of said array of sockets occupies an outer part of said array of sockets.

* * * * *

UNITED STATES PATENT AND TRADEMARK OFFICE
CERTIFICATE OF CORRECTION

PATENT NO. : 5,668,407
DATED : September 16, 1997
INVENTOR(S) : TASHIRO et al.

It is certified that error appears in the above-identified patent and that said Letters Patent is hereby corrected as shown below:

Col. 3, line 36, after "error" insert --.-- and begin a new paragraph with --According to the present invention, an IC package can--.

Signed and Sealed this

Third Day of February, 1998

BRUCE LEHMAN

Attest:

Attesting Officer

Commissioner of Patents and Trademarks